(12) United States Patent
Grove et al.

(10) Patent No.: US 11,566,508 B2
(45) Date of Patent: Jan. 31, 2023

(54) WELLBORE PERFORATION ANALYSIS AND DESIGN SYSTEM

(71) Applicant: HALLIBURTON ENERGY SERVICES, INC., Houston, TX (US)

(72) Inventors: Brenden Michael Grove, Mansfield, TX (US); Dennis James Haggerty, Burleson, TX (US); Jacob Andrew McGregor, Fort Worth, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 242 days.

(21) Appl. No.: 16/599,023

(22) Filed: Oct. 10, 2019

(65) Prior Publication Data

US 2020/0284136 A1   Sep. 10, 2020

Related U.S. Application Data

(60) Provisional application No. 62/813,502, filed on Mar. 4, 2019.

(51) Int. Cl.
| | | |
|---|---|---|
| *E21B 47/007* | (2012.01) | |
| *E21B 44/00* | (2006.01) | |
| *G06F 30/20* | (2020.01) | |

(52) U.S. Cl.
CPC ............ *E21B 44/00* (2013.01); *E21B 47/007* (2020.05); *G06F 30/20* (2020.01)

(58) Field of Classification Search
None
See application file for complete search history.

(56) References Cited

U.S. PATENT DOCUMENTS

| | | | |
|---|---|---|---|
| 8,734,960 B1 * | 5/2014 | Walker | F42B 1/028 |
| | | | 102/306 |
| 9,371,719 B2 | 6/2016 | Underdown | |

(Continued)

FOREIGN PATENT DOCUMENTS

| | | |
|---|---|---|
| KR | 2019950010112 | 11/1995 |
| WO | 0009421 | 2/2000 |
| WO | 2011163252 A1 | 12/2011 |

OTHER PUBLICATIONS

Ned Thomas Visualizing Wellbore Instability And Fracture Direction By Application Of Principal Stress Trajectory Analysis Texas A&M University, Aug. 2017 (Year: 2017).*

(Continued)

*Primary Examiner* — Rehana Perveen
*Assistant Examiner* — Cuong V Luu
(74) *Attorney, Agent, or Firm* — Kilpatrick Townsend & Stockton LLP

(57) ABSTRACT

Aspects and features include a system and method for wellbore perforation analysis and design. The system takes into account geomechanical considerations. In some examples the system determines wellbore parameters associated with a wellbore in a formation, calculates a current effective stress value associated with a hole in the formation, and determines a maximum effective stress value and a minimum wellbore pressure value. The system can then produce perforating job parameters to maximize a perforation while maintaining at least the minimum wellbore pressure value. In some examples, the system makes use of a parts database to determine job parameters that can implemented based on available parts.

19 Claims, 6 Drawing Sheets

(56) References Cited

U.S. PATENT DOCUMENTS

| | | | |
|---|---|---|---|
| 2006/0070900 A1 | 4/2006 | Brunson et al. | |
| 2007/0044969 A1* | 3/2007 | Grove | E21B 21/08 |
| | | | 166/297 |
| 2007/0050144 A1* | 3/2007 | Grove | E21B 43/119 |
| | | | 702/6 |
| 2009/0055098 A1* | 2/2009 | Mese | E21B 43/00 |
| | | | 702/13 |
| 2010/0147587 A1 | 6/2010 | Henderson et al. | |
| 2011/0000669 A1 | 1/2011 | Barlow et al. | |
| 2011/0264429 A1* | 10/2011 | Lee | E21B 47/022 |
| | | | 703/10 |
| 2012/0150515 A1* | 6/2012 | Hariharan | E21B 33/124 |
| | | | 703/7 |
| 2013/0118745 A1 | 5/2013 | Grove et al. | |
| 2014/0231307 A1 | 8/2014 | Wen | |
| 2015/0168597 A1* | 6/2015 | Bai | G01V 99/00 |
| | | | 703/10 |
| 2015/0176387 A1 | 6/2015 | Wutherich | |
| 2016/0024911 A1 | 1/2016 | Bell et al. | |
| 2016/0357883 A1* | 12/2016 | Weng | E21B 43/267 |
| 2017/0145818 A1 | 5/2017 | Prioul et al. | |
| 2017/0165829 A1 | 6/2017 | Damberg | |
| 2018/0371883 A1* | 12/2018 | Enkababian | E21B 49/00 |
| 2019/0048706 A1* | 2/2019 | Benson | E21B 44/00 |
| 2019/0277133 A1* | 9/2019 | Bell | E21B 47/007 |
| 2021/0140290 A1* | 5/2021 | Eslinger | F04D 13/10 |

OTHER PUBLICATIONS

Samuel Ng'ang'a Wellbore Stability—Principles And Analysis In Geothermal Well Drilling United Nations University Orkustofnun, Central Iceland, Nov. 2018 (Year: 2018).*

PCT Application No. PCT/US2019/055726, International Search Report and Written Opinion, dated Sep. 4, 2020, 9 pages.

PCT Application No. PCT/US2019/055726, International Search Report and Written Opinion, dated Dec. 27, 2019, 10 pages.

Haggerty, et al., "Investigating the Impact of Dynamic Effective Stress While Perforating Low-Strength Formations", Available Online at: https://www.onepetro.org/conference-paper/SPE-189314-MS, 2018, 11 pages.

Walton, "Optimum Underbalance for the Removal of Perforation Damage", Available Online at: https://www.onepetro.org/conference-paper/SPE-63108-MS, 2000, 13 pages.

* cited by examiner

WELLBORE PERFORATION ANALYSIS AND DESIGN SYSTEM

CROSS-REFERENCE TO RELATED APPLICATIONS

This application claims the benefit of U.S. Provisional Application No. 62/813,502 filed Mar. 4, 2019, which is herein incorporated by reference in its enitrety.

TECHNICAL FIELD

The present disclosure relates generally to using a perforation tool to aid production in well systems. More specifically, but not by way of limitation, this disclosure relates to providing automated operational design for perforation operations using such a perforation tool.

BACKGROUND

Hydrocarbons can be produced from wellbores drilled from the surface through a variety of producing and non-producing formations. A wellbore may be substantially vertical or may be offset. A variety of servicing operations can be performed on a wellbore after it has been drilled. For example, a lateral junction can be set in the wellbore at the intersection of two lateral wellbores or at the intersection of a lateral wellbore with the main wellbore. A casing string can be set and cemented in the wellbore. A liner can be hung in the casing string. The casing string can be perforated by using a perforation tool, for example, by firing a perforation gun.

Perforation tools can include explosive charges for perforating a casing and creating perforations or tunnels into the subterranean formation that is proximate to the wellbore. Creating a large perforation without introducing significant sand production or causing instability issues is desirable.

DETAILED DESCRIPTION

Figure 1:
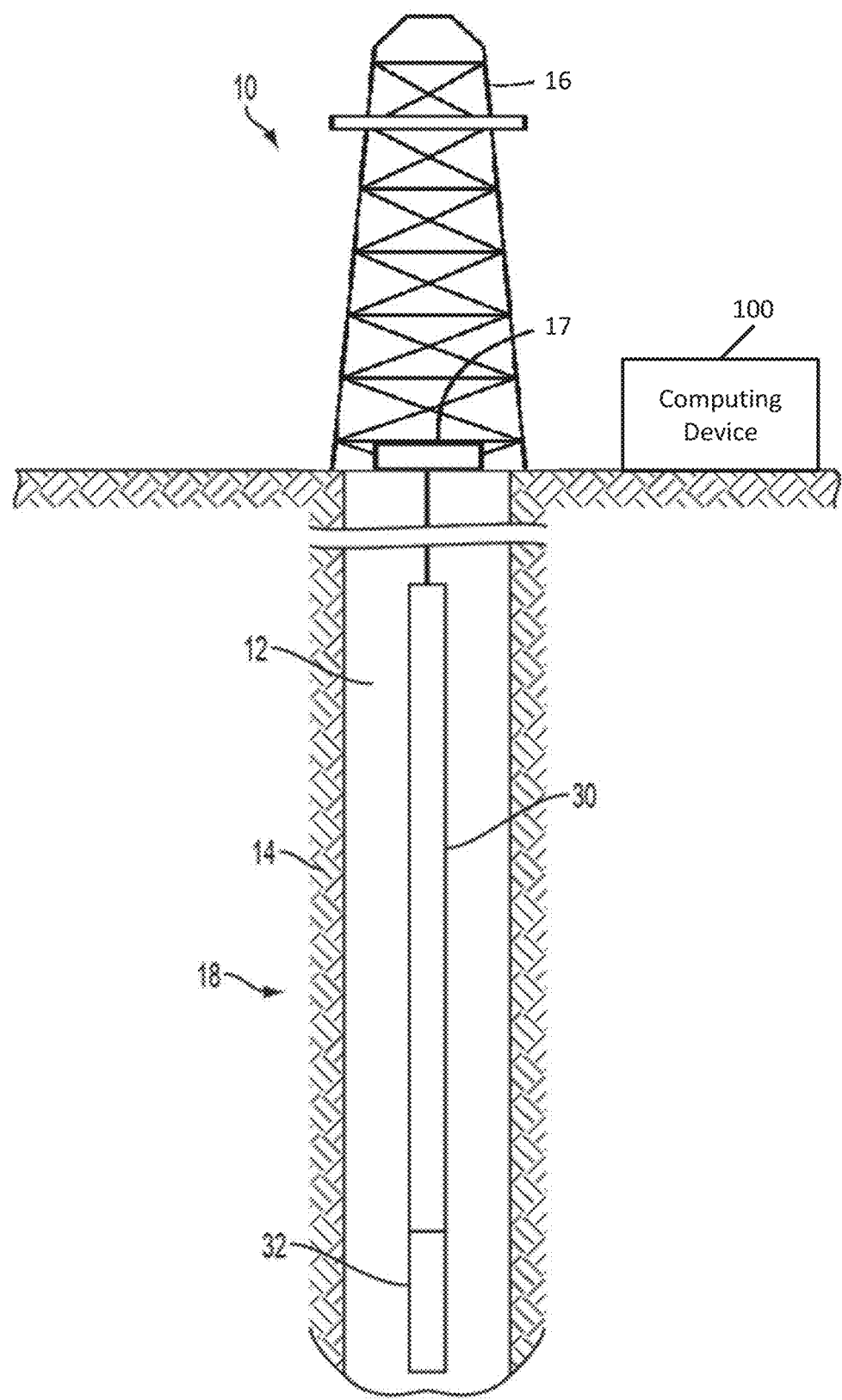
FIG. 1 is a schematic view of a wellbore environment that includes a perforation tool and a computing device to provide perforation analysis and design according to some aspects of the disclosure.

Certain aspects and features relate to an analysis and design system that produces specific parameters to be used for perforating a wellbore. The system can take into account geomechanical considerations specific to the wellbore and the formation to reduce the likelihood of instability leading to tunnel collapse or transient sanding. Being able to design perforating jobs in an automated and repeatable way to reduce the chance of perforation collapse or excessive sanding can significantly reduce poor performance risk when completing and producing from (or injecting into) hydrocarbon wells.

Perforation tunnel collapse or excessive sand production can accompany perforation-induced pressure transients. When collapse, significant sanding, or both occur, the production performance of a well suffers. Aspects and features of the disclosure determine a current effective stress value associated with a hole in the formation. The hole is in pressure equilibrium with the wellbore. A maximum effective stress value that the hole can support without collapsing can be determined, and a minimum wellbore pressure value can be determined. Perforating job parameters are produced to maximize a perforation while maintaining at least the minimum wellbore pressure value. In some aspects, these perforating job parameters are produced by simulating expected downhole wellbore pressure transients of the type that could otherwise cause tunnel collapse or excessive sanding. The perforating job parameters describe the specifics of how a perforating job will be executed, and may also be collectively referred to as a perforating job design or a perforating operation design.

In some examples, the system can control or direct the perforation of the formation using the perforating job parameters. In some examples, perforating job parameters can include one or more of perforation tool components, string assembly components, or wellbore components. These components may be specified in part by accessing a parts database.

In some examples, the maximum effective stress value is determined theoretically by approximating a threshold maximum effective stress value as equal to a multiple of unconfined compressive strength, a hollow cylinder strength, or a thick-walled cylinder strength. In other examples, the maximum effective stress value is determined experimentally by recording a failure point for a hole or perforation in a core sample with properties representative of the formation.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

In some examples, a system includes a processing device and a non-transitory memory device storing instructions that are executable by the processing device to cause the processing device to perform operations. The operations include determining wellbore parameters associated with a wellbore in a formation, calculating, using the wellbore parameters, a current effective stress value associated with a hole in the formation when the hole is in pressure equilibrium with the wellbore. The operations include determining, using the wellbore parameters and the current effective stress value, a maximum effective stress value that the hole can support without collapsing, and determining a minimum wellbore pressure value using the maximum effective stress value. Perforating job parameters are produced. These perforating job parameters can balance maximizing a perforation and maintaining at least the minimum wellbore pressure value.

FIG. 1 is a schematic view of a wellbore system 10 that includes a perforation tool. The system 10 includes a derrick 16 that extends over and around a wellbore 12 that penetrates a subterranean formation 14 for the purpose of recovering hydrocarbons. Derrick 16 includes a hoisting device 17 for raising and lowering work strings, pipe strings, etc. The wellbore 12 may be drilled into the subterranean formation 14 using any suitable drilling technique. While shown as extending vertically from the surface in FIG. 1, in other examples the wellbore 12 may be deviated, horizontal, or curved over at least some portions of the wellbore 12. The wellbore 12 may be cased, open hole, contain tubing, and may include a hole in the ground having a variety of shapes or geometries.

The derrick 16 may serve as a completion rig, a workover rig, a servicing rig, or other mast structure, or a combination of these. In some aspects, derrick 16 may include a rig floor through which a workstring extends downward into the wellbore 12. Other mechanical mechanisms that are not shown may control the run-in and withdrawal of a workstring in the wellbore 12. Examples of these other mechanical mechanisms include a draw works coupled to a hoisting apparatus, a slickline unit or a wireline unit including a winching apparatus, another servicing vehicle, and a coiled tubing unit. The workstring may include a conveyance 30, a perforation tool 32, and other tools or subassemblies (not shown) located above or below the perforation tool 32. In some examples, the perforation may be referred to as a perforation gun and the conveyance may be referred to as a gunstring. The conveyance 30 may include any of a slickline, a coiled tubing, a string of jointed pipes, a wireline, and other conveyances for the perforation tool 32. The perforation tool 32 can include one or more explosive charges that may be triggered to explode for perforating a casing (if present), perforating a wall of the wellbore 12, and forming perforations or tunnels out into the formation 14. The perforating may promote recovering hydrocarbons from the formation 14 for production at the surface, storing hydrocarbons flowing into the formation 14, or injecting any fluid into the formation 14.

Still referring to FIG. 1, the wellbore system 10 includes a computing device 100. The computing device 100 can be installed in a temporary building or shelter where well operators can observe simulation output and design parameters generated by the computing device, can be deployed in a vehicle, be hand-held, or be remotely located. In some examples, the computing device 100 can process data received and generate designs for perforation operations, in some example, including configurations for perforation tool 13. Computing device 100 includes a processing device interfaced with other hardware via a bus. A memory, which can include any suitable tangible (and non-transitory) computer-readable medium, such as RAM, ROM, EEPROM, or the like, can embody program components that configure operation of the computing device 100, as described immediately below.

Figure 2:
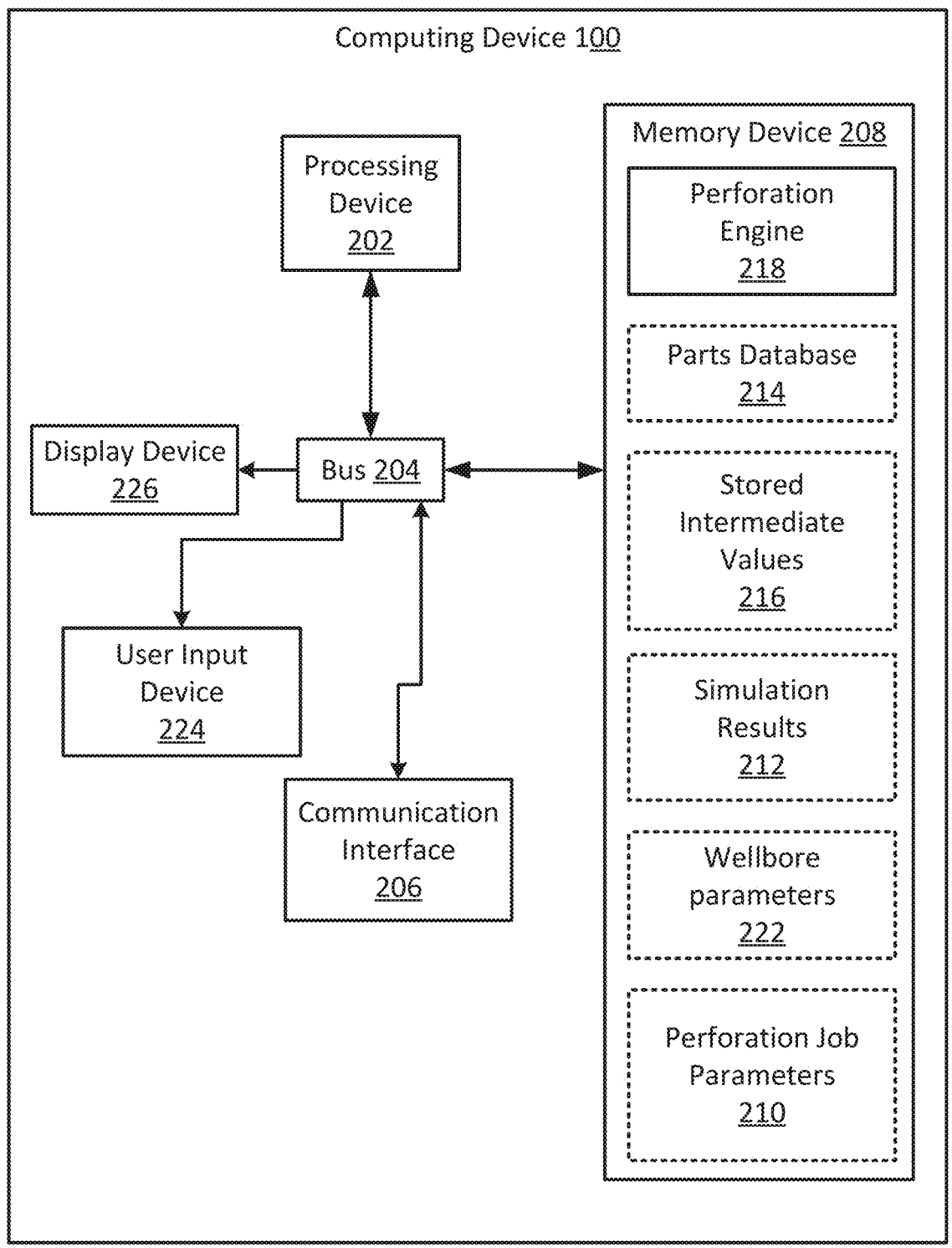
FIG. 2 is block diagram of a computing device for providing perforation analysis and design according to some aspects of the disclosure.

FIG. 2 is a block diagram of an example of the computing device 100 of system 10. The computing device 100 includes a processing device 202, a bus 204, a communication interface 206, a memory device 208, a user input device 224, and a display device 226. In some examples, some or all of the components shown in FIG. 2 can be integrated into a single structure, such as a single housing. In other examples, some or all of the components shown in FIG. 2 can be distributed (e.g., in separate housings) and in communication with each other. The processing device 202 can execute one or more operations for designing a perforation operation. In some examples, the perforation operation includes a recommended configuration of perforation tool 32, a perforation procedure, a wellbore configuration (recommended fluids or completion configuration) or a combination of any or all of these. The processing device 202 can execute instructions stored in the memory device 208 to perform the operations. The processing device 202 can include one processing device or multiple processing devices. Non-limiting examples of the processing device 202 include a field-programmable gate array ("FPGA"), an application-specific integrated circuit ("ASIC"), a microprocessor, etc.

The processing device 202 shown in FIG. 2 is communicatively coupled to the memory device 208 via the bus 204. The non-transitory memory device 208 may include any type of memory device that retains stored information when powered off. Non-limiting examples of the memory device 208 include electrically erasable and programmable read-only memory ("EEPROM"), flash memory, or any other type of non-volatile memory. In some examples, at least some of the memory device 208 can include a non-transitory computer-readable medium from which the processing device 202 can read instructions. A computer-readable medium can include electronic, optical, magnetic, or other storage devices capable of providing the processing device 202 with computer-readable instructions or other program code. Non-limiting examples of a computer-readable medium include (but are not limited to) magnetic disk(s), memory chip(s), read-only memory (ROM), random-access memory ("RAM"), an ASIC, a configured processing device, optical storage, or any other medium from which a computer processing device can read instructions. The instructions can include processing device-specific instructions generated by a compiler or an interpreter from code written in any suitable computer-programming language, including, for example, C, C++, C#, etc.

Still referring to the example of FIG. 2, the memory device 208 includes stored intermediate values 216 used in running simulations and making calculations to determine the design of a perforation operation. These intermediate values can include, as examples, one or more of a current effective stress value, a maximum effective stress value, or a minimum wellbore pressure value. The memory device 208 includes computer program code instructions for a perforation engine 218. The perforation engine can be executed by processing device 202 for causing the computing device to perform operations according to various examples of the present disclosure for producing a design for a perforating operation. Memory device 208 in this example includes wellbore parameters 222, which can be gathered directly from downhole sensors connected to a computing device or be input to a computing device manually. Simulations of perforating operations are used in determining perforation job parameters that make up a perforation job design 210, which can also be stored in memory device 208, and specify the perforation operation that has been designed by the system including the processing device 202 and the perforation engine 218, as well as memory device 208 and any peripherals or peripheral connections.

Continuing with FIG. 2, memory device 208 can also store simulation results 212, which can be input by a user, gathered from sensors, or received as outputs from other operations. Simulation results, as an example, can include one or more of stability thresholds, collapse thresholds, or numerical descriptions of downhole wellbore pressure transients. In some examples, a perforating operation design may be constrained by the selection of perforating tool parts available, or by the selection of other parts related to the perforation operation, such as wellbore fluids or completion components. Computing device 100 in this example includes a parts database 214, listing relevant parts and includes data regarding their availability. Although parts database 214 is illustrated as stored in memory device 208, such a database may be located remotely and access by computing device 100 over a network or from a cloud. In such a case, the database or portions of the database can be cached in memory device 208.

In some examples, the computing device 100 of FIG. 2 includes a communication interface 206. The communication interface 206 can represent one or more components that facilitate a network connection or otherwise facilitate communication between electronic devices. Examples include, but are not limited to, wired interfaces such as Ethernet, USB, IEEE 1394, or wireless interfaces such as IEEE 802.11, Bluetooth, near-field communication (NFC) interfaces, RFID interfaces, or radio interfaces for accessing cellular telephone networks (e.g., transceiver/antenna for accessing a CDMA, GSM, UMTS, or other mobile communications network).

In some examples, the computing device 100 of FIG. 2 includes a user input device 224. The user input device 224 can represent one or more components used to input data. Examples of the user input device 224 can include a keyboard, mouse, touchpad, button, or touch-screen display, etc. In some examples, the computing device 100 includes a display device 226. Examples of the display device 226 can include a liquid-crystal display (LCD), a computer monitor, a touch-screen display, etc. In some examples, the user input device 224 and the display device 226 can be a single device, such as a touch-screen display.

Figure 3:
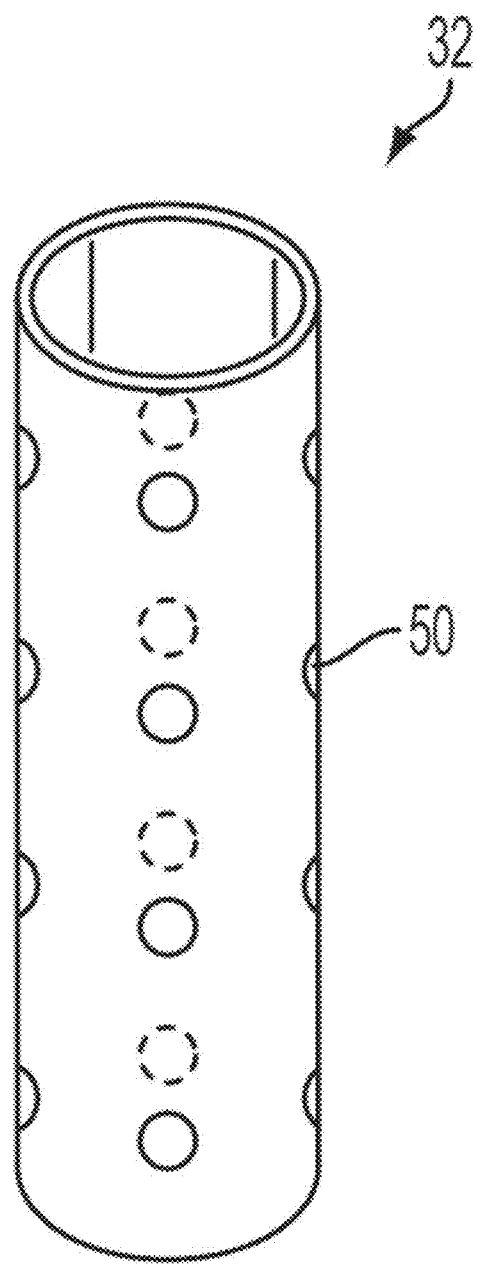
FIG. 3 is a perspective view of an example of a perforation tool that can be configured using a computing device according to some aspects of the disclosure.

FIG. 3 is a perspective view of an example of a perforation tool that can be configured using a computing device according to some aspects of the disclosure. FIG. 3 depicts by perspective view an example of the perforation tool 32 that includes one or more explosive shaped-charge assemblies 50. The perforation tool 32 may include a tool body (not shown) that contains the shaped-charge assemblies 50 and that protects and seals them from the downhole environment prior to perforation. A surface of the tool body may be bored or countersunk, or both, proximate to the shaped-charge assemblies 50 to promote ease of perforation of the tool body by detonation of the shaped-charge assemblies 50. The tool body may be constructed out of various metal materials. The tool body may be constructed of one or more kinds of steel, including stainless steel, chromium steel, and other steels. Alternatively, the tool body may be constructed of other non-steel metals or metal alloys. The automated perforation analysis and design system described herein my produce a perforation operation design 210 that includes a selection of a type of tool body or tool materials.

Still referring to FIG. 3, the shaped-charge assemblies 50 may be disposed in a plane at any of various angles relative to the axis of the tool body, and additional planes or rows of additional shaped-charge assemblies 50 may be positioned above and below a first plane. The direction of the shaped-charge assemblies 50 may be offset by some amount between the first plane and a second plane, to promote more densely arranging the shaped-charge assemblies 50 within the tool body. The angle of offset may also be specified or recommended as part of a perforation operation design. A frame structure (not shown) may be included in the tool body and can retain the shaped-charge assemblies 50 in planes, oriented in a preferred direction, and with appropriate angular relationships between rows as specified in a perforation operation design 210 generated by the perforation engine 218 of FIG. 2 executed by processing device 202. In some aspects, a detonator cord couples to each of the shaped-charge assemblies 50 to detonate the shaped-charge assemblies 50. Additionally, the charge loading (amount of explosive material) in the charges as well as the number of charges can be specified in the design. More charges or more material in the charges increases the perforation force. Charge shape can also be a parameter of the design produced by the computer device.

Figure 4:
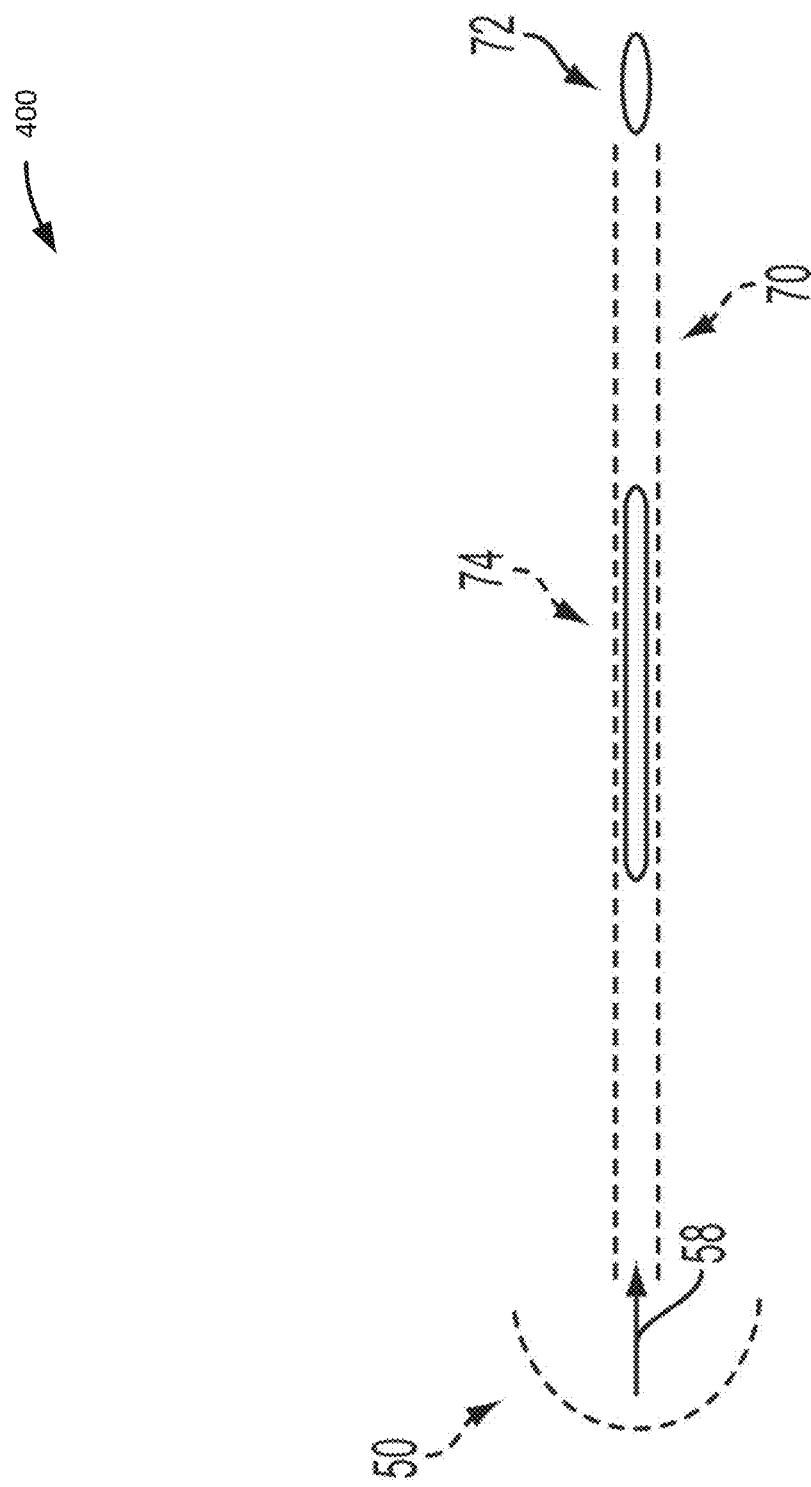
FIG. 4 is a diagram of an explosive jet from a shaped-charge assembly that has been configured according to some aspects of the disclosure.

FIG. 4 is a diagram 400 of a detonation of the shaped-charge assembly 50 that has been configured according to some aspects of the disclosure. When the shaped charge in the shaped-charge assembly 50 is detonated, for example by the propagation of a detonation from the detonator cord to the shaped charge, the energy of the detonation can be concentrated or focused along an explosive focus axis 58, forming a detonation jet 70 indicated by the dotted line. A portion of a shaped-charge liner (not shown) may form a projectile 72 that is accelerated by the energy of detonation and forms the leading edge of the detonation jet 70 as it penetrates into the casing or formation of the well. Another portion may form a slug 74 can break up more easily and reduce the amount of debris as a result of the perforation operation. Appropriate material, shapes, and positioning for such portions may be part of the perforation operation design 210 determined by perforation engine 218 executed by processing device 202

Figure 5:
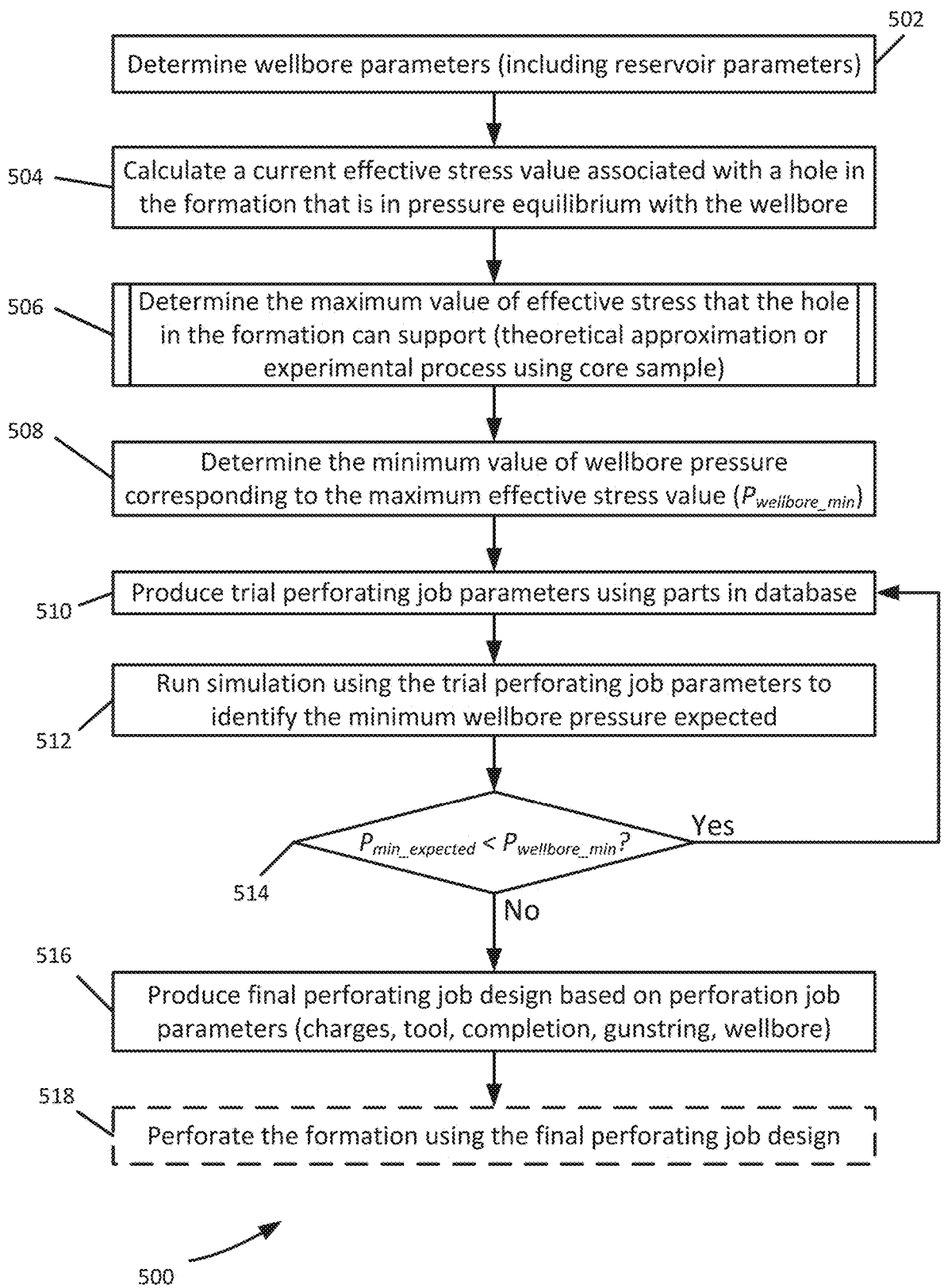
FIG. 5 is a flowchart illustrating a process for the design of a perforation operation according some aspects of the disclosure.

FIG. 5 is a flowchart illustrating a process 500 for the automated design of a perforation operation according some aspects of the disclosure. At block 502, processing device 202 determines wellbore parameters, which may include reservoir or formation parameters in addition to parameters strictly associated with the wellbore itself. Examples of wellbore parameters include overburden stress, reservoir pressure, formation unconfined compressive strength, and wellbore pressure. The parameters can be determined by computing device 100 receiving data from sensors that detect or monitor attributes of the well. The computing device can also receive the parameters by accessing recorded data on a network or by receiving the parameters through user input device 224 or communication interface 206. At block 504, processing device 202 calculates a current effective stress value associated with a hole in the formation that is in pressure equilibrium with the wellbore. Processing device 202 calculates effective stress around a hole such as a perforation tunnel in the formation. The effective stress ($P_{eff}$) can be calculated by subtracting the wellbore pressure ($P_{wellbore}$) from the overburden pressure ($P_{overburden}$).

Still referring to FIG. 5, at block 506, processing device 202 determines the maximum value of effective stress that the hole in the formation can support. The maximum value of effective stress is the maximum stress that the hole in the formation can support before collapsing or the stress that causes excessive sand production. Determining the maximum value of effective stress ($P_{eff\_max}$) can be done experimentally, theoretically, or by some combination of the two. Experimentally determining the maximum value is described below with reference to FIG. 6. For a theoretical determination, a threshold maximum effective stress value can be set to a multiple of unconfined compressive strength (UCS), a hollow cylinder strength, or a thick-walled cylinder strength. To use the UCS, A critical $P_{eff\_max}$ is treated as the threshold and approximated as some multiple of the UCS. For example, $P_{eff\_max}$ can be estimated as approximately four times UCS as a starting point. Calculations, numerical simulations, etc. can be performed to obtain a stability or collapse threshold.

Continuing with FIG. 5, at block 508, processing device 202 determine the minimum value of wellbore pressure, $P_{wellbore\_min}$, corresponding to the maximum effective stress value. At block 510, the computing device 100 produces trial perforating job parameters, which define a perforation operation design. At block 512, processing device 202 runs a simulation using the trial perforating job parameters to identify the minimum wellbore pressure expected for the design, and stores simulation results 212. At block 514, a determination is made as to whether minimum wellbore pressure achieved during the simulated perforation operation, $P_{min\_expected}$, falls below $P_{wellbore\_min}$. If so, process 500 returns to block 510, new trial perforating job parameters are produced, and a simulation is run again at block 512. Otherwise, a perforating job design based on the final set of perforating job parameters is produced at block 516. Optionally, the perforating job can be executed under the direct or indirect control of processing device 202 at block 518.

In some examples, computer simulations are carried out using existing software (e.g. PulsFrac®, ShockPro™) to calculate the expected downhole wellbore pressure transients associated with the proposed perforating operation. $P_{min\_expected}$ is compared with $P_{wellbore\_min}$ for each simulation run at block 512. Whenever $P_{min\_expected}$ is less than $P_{wellbore\_min}$, then changes to the perforating job parameters are implemented to increase the value of $P_{min\_expected}$ until it is equal to or greater than $P_{wellbore\_min}$. Perforating job parameters that form all or part of the perforation operation design can include parameters related the perforating gun system design, placement, or other aspects, parameters related to completion assembly design, and parameters related to the wellbore configuration, such as wellbore fluids, volume of those fluids, etc. The parameters can include the specification of components for the perforation gun, the gunstring, or the wellbore. Selection of these components can be limited by the computing device to what is physically available or can be acquired on a reasonable schedule by accessing parts database 214, which can include entries related to one or more of perforation tool components, string assembly components (for example, the gunstring), or wellbore components that form a portion of the wellbore environment.

Examples of further parameters that can be specified as part of the design of a perforating gun include, for the charges, size (explosive gram load) and quantity (number of charges per unit volume of perforation gun), explosive type (more or less energetic, higher or lower energy output explosives), the amount of free volume in the gun interior, and whether pressure enhancers are installed in the gun interior. Examples of further parameters that can be specified as part of the design of the completion or the gunstring assembly include components to increase pressure such as propellant-filled chambers (with time delays as necessary). Examples of parameters that can be specified as part of the design of a wellbore environment include fluid to be used, for example, a more compliant fluid having one or more of a lower density, a characteristic sound speed, or a specific bubbly quality. Wellbore parameters can also include parts or equipment designed to achieve a specific fluid volume. For example, larger casing diameters, packers, etc., placed further from gunstring can increase fluid volume.

The process of designing a perforation operation for the characteristics for the wellbore or formation at hand and executing the perforation operation can be automated to varying extents. For example, portions of the process can be performed by the computing system directing local personnel with respect to obtaining and placing a core sample for analysis and assembling components of a perforation tool and a gunstring, while all other aspects are automated, including executing the perforation operation, since a perforating gun can be fired under computer control. It is also possible for a computer system running the perforation engine to gather data from sensors, design the perforation operation, and execute the perforation operation in a completely automated fashion. If necessary, given available equipment, adjustable perforation job parameters can be limited to wellbore fluid types and volumes, time delays, and other factors that can be controlled from the surface. The perforation engine can be configured to determine the maximum effective stress value theoretically as previously discussed, run simulations, adjust the simulated perforation job parameters, and then set the final, physical parameters. The computer system can then perform the perforation operation.

Alternatively, the computer system can perform an analysis and instruct personnel regarding perforating tool configuration and other physical configuration parameters without providing intermediate details. In such a case, the personnel can configure equipment for the perforation operation without making independent determinations. The perforation engine can access the parts database to ensure the availability of the parts that the personnel would need. The computer system can alternatively display intermediate results and analysis as well as a recommended perforation job design without specific instructions. In such a case, the system is may be used as an analysis system operating in an advisory capacity.

Figure 6:
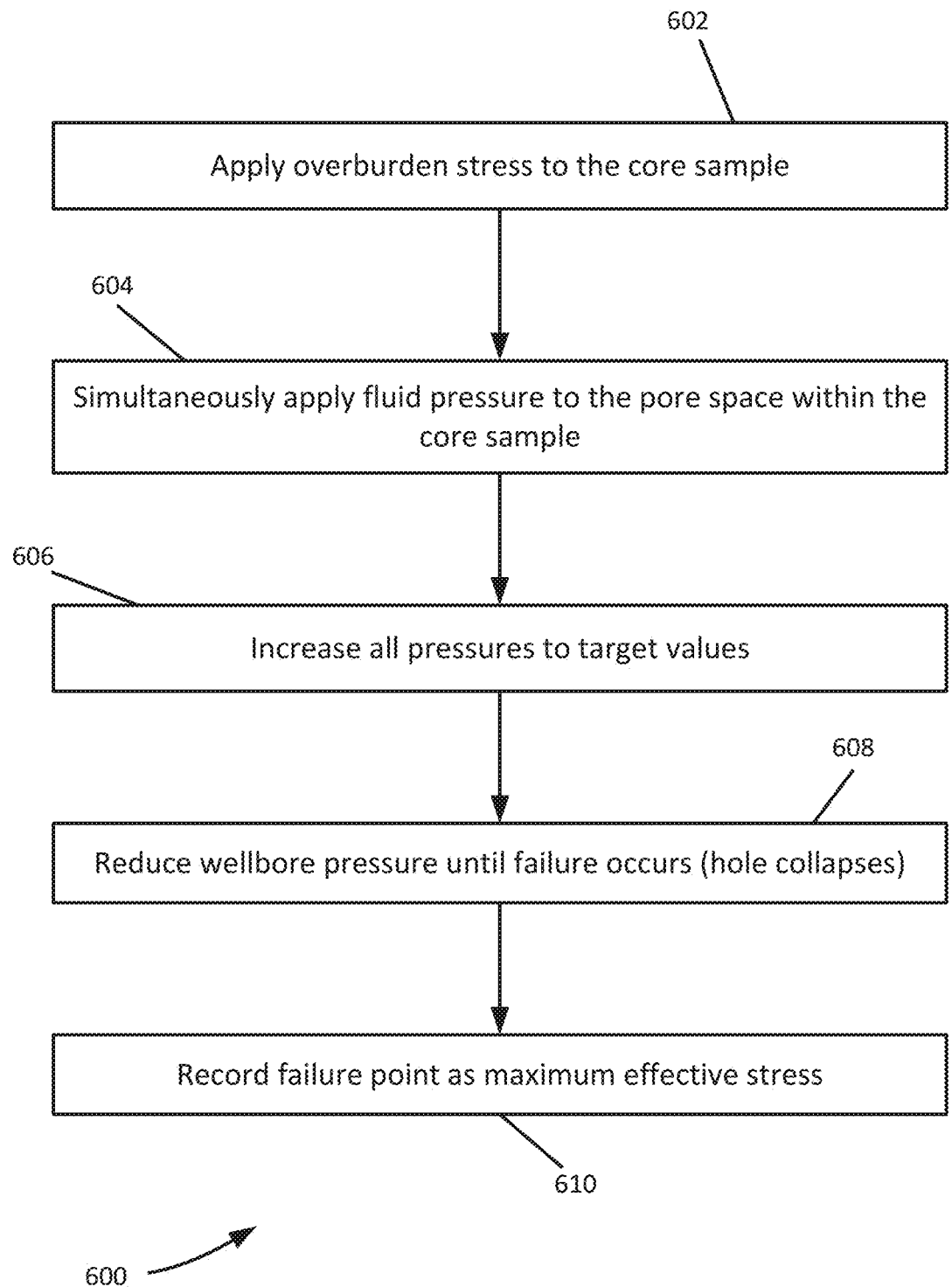
FIG. 6 is a flowchart illustrating a process for a portion of the design of a perforation operation according some aspects of the disclosure.

FIG. 6 is a flowchart illustrating a process 600 for experimentally determining maximum effective stress. Initially a hole is drilled, or a perforation is created to create a tunnel in a rock core sample with properties that are representative of the formation of interest. The sample can then be placed in a processor-controlled test bed, or tools can be used to apply overburden stress to the core at block 602. In conjunction with applying overburden stress, fluid pressure is simultaneously applied at block 604 to the pore space within the sample. The pore fluid pressure can also exist within the hole or tunnel and the wellbore to which the tunnel is hydraulically connected. During the process, the difference between the overburden and pore or wellbore pressure (i.e. the effective stress) can be kept to a moderate value to avoid inducing any failure or collapse of the tunnel. The system pressures are increased to target values at block 606. Once the system pressures reach their target values, the wellbore pressure is reduced at block 608. The wellbore pressure can continue to be reduced (thus increasing the effective stress near the tunnel) until the tunnel collapses or otherwise fails. This failure point is recorded at block 610 and can be treated as the maximum effective stress ($P_{eff\_max}$).

Wellbore pressure can be reduced slowly or quickly. If the reduction rate influences the value of $P_{eff\_max}$, the influence can indicate a rate dependency in the tunnel collapse threshold. In this case, a value corresponding to rates representative of perforating can be used to reach the recorded failure point (i.e., pressure drops of hundreds to thousands of psi over timescales of 10-100 milliseconds). If a system is set up to automate or partially automate the perforation operation, the computer system controlling the perforation operation can also be used to experimentally determine $P_{eff\_max}$ as shown in FIG. 6. Alternatively, two different automated or semi-automated systems can be used.

Unless specifically stated otherwise, it is appreciated that throughout this specification that terms such as "processing," "calculating," "determining," "operations," or the like refer to actions or processes of a computing device, such as the controller or processing device described herein, that can manipulate or transform data represented as physical electronic or magnetic quantities within memories, registers, or other information storage devices, transmission devices, or display devices. The order of the process blocks presented in the examples above can be varied, for example, blocks can be re-ordered, combined, or broken into sub-blocks. Certain blocks or processes can be performed in parallel. The use of "configured to" herein is meant as open and inclusive language that does not foreclose devices configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Elements that are described as "connected," "connectable," or with similar terms can be connected directly or through intervening elements. Terms such as "less than" and "greater than" can include the concept of equality. Terms such as "maximum" and "minimum" when used in comparisons can include the concept of equality or the concepts of "greater than" or "less than" as appropriate.

In some aspects, a wellbore perforation analysis and design system is provided according to one or more of the following examples. As used below, any reference to a series of examples is to be understood as a reference to each of those examples disjunctively (e.g., "Examples 1-4" is to be understood as "Examples 1, 2, 3, or 4").

Example 1

A system includes a processing device, and a non-transitory memory device including instructions that are executable by the processing device to cause the processing device to perform operations. The operations include determining wellbore parameters associated with a wellbore in a formation; calculating, using the wellbore parameters, a current effective stress value associated with a hole in the formation, the hole being in pressure equilibrium with the wellbore. The operations further include determining, using the wellbore parameters and the current effective stress value, a maximum effective stress value that the hole can support without collapsing, determining a minimum wellbore pressure value using the maximum effective stress value, and producing perforating job parameters to maximize a perforation while maintaining at least the minimum wellbore pressure value.

Example 2

The system of example 1, wherein the operation of determining, using the wellbore parameters and the current effective stress value, the maximum effective stress value, includes the operation of recording a failure point for a hole or perforation in a sample with properties representative of the formation.

Example 3

The system of example(s) 1-2, wherein the operation of determining, using the wellbore parameters and the current effective stress value, the maximum effective stress value, includes approximating a threshold maximum effective stress value as equal to a multiple of unconfined compressive strength, a hollow cylinder strength, or a thick-walled cylinder strength, and performing a numerical calculation or a simulation using the maximum effective stress value to obtain a stability threshold or a collapse threshold.

Example 4

The system of example(s) 1-3, wherein producing the perforating job parameters to maximize a perforation while maintaining at least the minimum wellbore pressure value includes running a simulation to calculate expected downhole wellbore pressure transients associated with a proposed perforating operation.

Example 5

The system of example(s) 1-4, wherein producing perforating job parameters to maximize a perforation while maintaining at least the minimum wellbore pressure value includes repeating the simulation to calculate the expected downhole wellbore pressure transients, and altering the perforating job parameters.

Example 6

The system of example(s) 1-5, further including a parts database communicatively coupled to the processing device, wherein the perforating job parameters include parts specified from the parts database.

Example 7

A method includes calculating, using a processing device and using wellbore parameters associated with a wellbore in a formation, a current effective stress value associated with a hole in the formation, the hole being in pressure equilibrium with the wellbore, determining, using the processing device, the wellbore parameters, and a current value of effective stress, a maximum effective stress value that the hole can support without collapsing, determining, using the processing device and the maximum effective stress value, a minimum wellbore pressure value, and producing, using the processing device, perforating job parameters to maximize a perforation while maintaining at least the minimum wellbore pressure value.

Example 8

The method of example 7, further including perforating the formation using the perforating job parameters.

Example 9

The method of example(s) 7-8, wherein the job parameters include at least one of perforation tool components, string assembly components, or wellbore components.

Example 10

The method of example(s) 7-9, further including accessing a parts database including the at least one of perforation tool components, string assembly components, or wellbore components.

Example 11

The method of example(s) 7-10, wherein determining the maximum effective stress value includes recording a failure point for a hole or perforation in a sample with properties representative of the formation.

Example 12

The method of example(s) 7-11, wherein determining the maximum effective stress value includes approximating a threshold maximum effective stress value as equal to a multiple of unconfined compressive strength, a hollow cylinder strength, or a thick-walled cylinder strength, and performing a numerical calculation or a simulation to obtain a stability threshold or a collapse threshold.

Example 13

The method of example(s) 7-12, wherein producing the perforating job parameters includes running a simulation to calculate expected downhole wellbore pressure transients associated with a proposed perforating operation.

Example 14

The method of example(s) 7-13, wherein producing the perforating job parameters further includes repeating the simulation to calculate the expected downhole wellbore pressure transients, and altering the perforating job parameters.

Example 15

A non-transitory computer-readable medium includes instructions that are executable by a processing device for causing the processing device to perform operations. The operations include determining wellbore parameters associated with a wellbore in a formation; calculating, using the wellbore parameters, a current effective stress value associated with a hole in the formation, the hole being in pressure equilibrium with the wellbore, determining, using the wellbore parameters and the current effective stress value, a maximum effective stress value that the hole can support without collapsing, determining a minimum wellbore pressure value using the maximum effective stress value, and producing perforating job parameters to maximize a perforation while maintaining at least the minimum wellbore pressure value.

Example 16

The non-transitory computer-readable medium of example 15, wherein the operation of determining, using the wellbore parameters and the current effective stress value, the maximum effective stress value, includes the operation of recording a failure point for a hole or perforation in a sample with properties representative of the formation.

Example 17

The non-transitory computer-readable medium of example(s) 15-16, wherein the operation of determining, using the wellbore parameters and the current effective stress value, the maximum effective stress value, includes approximating a threshold maximum effective stress value as equal to a multiple of unconfined compressive strength, a hollow cylinder strength, or a thick-walled cylinder strength; and performing a numerical calculation or a simulation to obtain a stability threshold or a collapse threshold.

Example 18

The non-transitory computer-readable medium of example(s) 15-17, wherein producing the perforating job parameters to maximize a perforation while maintaining at least the minimum wellbore pressure value includes running a simulation to calculate expected downhole wellbore pressure transients associated with a proposed perforating operation.

Example 19

The non-transitory computer-readable medium of example(s) 15-18, wherein producing the perforating job parameters to maximize a perforation while maintaining at least the minimum wellbore pressure value includes repeating the simulation to calculate the expected downhole wellbore pressure transients, and altering the perforating job parameters.

Example 20

The non-transitory computer-readable medium of example(s) 15-19, further including the operation of accessing a parts database including parts specified as part of the perforating job parameters.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system comprising:
a processing device; and
a non-transitory memory device including instructions that are executable by the processing device to cause the processing device to perform operations comprising:
determining wellbore parameters associated with a wellbore in a formation based at least in part from data received from sensors in the wellbore;
calculating, using the wellbore parameters, a current effective stress value associated with a hole in the formation, the hole being in pressure equilibrium with the wellbore;
determining, using the wellbore parameters and the current effective stress value, a maximum effective stress value that the hole can support without collapsing;
determining a minimum wellbore pressure value using the maximum effective stress value;
producing perforating job parameters to maximize a perforation while maintaining at least the minimum wellbore pressure value comprises, the perforating job parameters comprising one or more parameters of a perforation tool for use in perforating the formation the one or more parameters including a first positioning of a first portion of a shaped-charge liner that forms a projectile and a second positioning of a second portion of the shaped-charge liner that forms a slug; and
perforating the formation using the perforating job parameters.

2. The system of claim 1, wherein the operation of determining, using the wellbore parameters and the current effective stress value, the maximum effective stress value, comprises the operation of recording a failure point for a hole or perforation in a sample with properties representative of the formation.

3. The system of claim 1, wherein the operation of determining, using the wellbore parameters and the current effective stress value, the maximum effective stress value, comprises:
approximating a threshold maximum effective stress value as equal to a multiple of unconfined compressive strength, a hollow cylinder strength, or a thick-walled cylinder strength; and
performing a numerical calculation or a simulation using the maximum effective stress value to obtain a stability threshold or a collapse threshold.

4. The system of claim 1, wherein producing the perforating job parameters to maximize a perforation while maintaining at least the minimum wellbore pressure value comprises running a simulation to calculate expected downhole wellbore pressure transients associated with a proposed perforating operation.

5. The system of claim 4, wherein producing perforating job parameters to maximize a perforation while maintaining at least the minimum wellbore pressure value comprises:
repeating the simulation to calculate the expected downhole wellbore pressure transients; and
altering the perforating job parameters.

6. The system of claim 1, further comprising a parts database communicatively coupled to the processing device, wherein the perforating job parameters include parts specified from the parts database.

7. A method comprising:
calculating, using a processing device and using wellbore parameters associated with a wellbore in a formation, a current effective stress value associated with a hole in the formation, the hole being in pressure equilibrium with the wellbore;
determining, using the processing device, the wellbore parameters, and a current value of effective stress, a maximum effective stress value that the hole can support without collapsing;
determining, using the processing device and the maximum effective stress value, a minimum wellbore pressure value;
producing, using the processing device, perforating job parameters to maximize a perforation while maintaining at least the minimum wellbore pressure value, the perforating job parameters comprising one or more parameters of a perforation tool, the one or more parameters including a first positioning of a first portion of a shaped-charge liner that forms a projectile and a second positioning of a second portion of the shaped-charge liner that forms a slug; and
perforating the formation using the perforating job parameters,
wherein the wellbore parameters associated with the wellbore in the formation are determined at least in part from data received from sensors in the wellbore.

8. The method of claim 7, wherein the job parameters comprise at least one of perforation tool components, string assembly components, or wellbore components.

9. The method of claim 8, further comprising accessing a parts database including the at least one of perforation tool components, string assembly components, or wellbore components.

10. The method of claim 7, wherein determining the maximum effective stress value comprises recording a failure point for a hole or perforation in a sample with properties representative of the formation.

11. The method of claim 7, wherein determining the maximum effective stress value comprises:
approximating a threshold maximum effective stress value as equal to a multiple of unconfined compressive strength, a hollow cylinder strength, or a thick-walled cylinder strength; and
performing a numerical calculation or a simulation to obtain a stability threshold or a collapse threshold.

12. The method of claim 7, wherein producing the perforating job parameters comprises running a simulation to calculate expected downhole wellbore pressure transients associated with a proposed perforating operation.

13. The method of claim 12, wherein producing the perforating job parameters further comprises:
repeating the simulation to calculate the expected downhole wellbore pressure transients; and
altering the perforating job parameters.

14. A non-transitory computer-readable medium that includes instructions that are executable by a processing device for causing the processing device to perform operations comprising:
determining wellbore parameters associated with a wellbore in a formation based at least in part from data received from sensors in the wellbore;
calculating, using the wellbore parameters, a current effective stress value associated with a hole in the formation, the hole being in pressure equilibrium with the wellbore;
determining, using the wellbore parameters and the current effective stress value, a maximum effective stress value that the hole can support without collapsing;
determining a minimum wellbore pressure value using the maximum effective stress value;
producing perforating job parameters to maximize a perforation while maintaining at least the minimum wellbore pressure value, the perforating job parameters comprising one or more parameters of a perforation tool for use in perforating the formation, the one or more parameters including a first positioning of a first portion of a shaped-charge liner that forms a projectile and a second positioning of a second portion of the shaped-charge liner that forms a slug; and
perforating the formation using the perforating job parameters.

15. The non-transitory computer-readable medium of claim 14, wherein the operation of determining, using the wellbore parameters and the current effective stress value, the maximum effective stress value, comprises the operation of recording a failure point for a hole or perforation in a sample with properties representative of the formation.

16. The non-transitory computer-readable medium of claim 14, wherein the operation of determining, using the wellbore parameters and the current effective stress value, the maximum effective stress value, comprises:
approximating a threshold maximum effective stress value as equal to a multiple of unconfined compressive strength, a hollow cylinder strength, or a thick-walled cylinder strength; and
performing a numerical calculation or a simulation to obtain a stability threshold or a collapse threshold.

17. The non-transitory computer-readable medium of claim 14, wherein producing the perforating job parameters to maximize a perforation while maintaining at least the minimum wellbore pressure value comprises running a simulation to calculate expected downhole wellbore pressure transients associated with a proposed perforating operation.

18. The non-transitory computer-readable medium of claim 17, wherein producing the perforating job parameters to maximize a perforation while maintaining at least the minimum wellbore pressure value comprises:
   repeating the simulation to calculate the expected downhole wellbore pressure transients; and
   altering the perforating job parameters.

19. The non-transitory computer-readable medium of claim 14, further comprising the operation of accessing a parts database including parts specified as part of the perforating job parameters.

* * * * *